United States Patent [19]
Agarwal et al.

[11] Patent Number: 6,156,638
[45] Date of Patent: Dec. 5, 2000

[54] INTEGRATED CIRCUITRY AND METHOD OF RESTRICTING DIFFUSION FROM ONE MATERIAL TO ANOTHER

[75] Inventors: Vishnu K. Agarwal; Garo J. Derderian, both of Boise, Id.

[73] Assignee: Micron Technology, Inc., Boise, Id.

[21] Appl. No.: 09/058,612

[22] Filed: Apr. 10, 1998

[51] Int. Cl.[7] .............................................. H01L 21/4763
[52] U.S. Cl. .................... 438/627; 438/653; 438/629; 438/618
[58] Field of Search ................................. 438/627, 653, 438/381, 396, 488, 158; 257/310

[56] References Cited

U.S. PATENT DOCUMENTS

| | | | |
|---|---|---|---|
| 4,333,808 | 6/1982 | Bhattacharyya et al. . | |
| 4,464,701 | 8/1984 | Roberts et al. | 361/313 |
| 4,891,682 | 1/1990 | Yusa et al. | 357/30 |
| 4,952,904 | 8/1990 | Johnson et al. . | |
| 5,053,917 | 10/1991 | Miyasaka et al. | 361/321 |
| 5,079,191 | 1/1992 | Shinriki et al. | 437/235 |
| 5,142,438 | 8/1992 | Reinberg et al. | 361/313 |
| 5,191,510 | 3/1993 | Huffman | 361/313 |
| 5,234,556 | 8/1993 | Oishi et al. | 204/157.51 |
| 5,279,985 | 1/1994 | Kamiyama | 437/60 |
| 5,293,510 | 3/1994 | Takenaka | 257/295 |
| 5,316,982 | 5/1994 | Taniguchi | 437/236 |
| 5,330,935 | 7/1994 | Dobuzinsky et al. | 437/239 |
| 5,335,138 | 8/1994 | Sandhu et al. | 361/303 |
| 5,348,894 | 9/1994 | Gnade et al. . | |
| 5,352,623 | 10/1994 | Kamiyama | 437/52 |
| 5,362,632 | 11/1994 | Mathews | 437/47 |
| 5,372,859 | 12/1994 | Thakoor | 427/551 |
| 5,397,446 | 3/1995 | Ishihara et al. . | |
| 5,442,213 | 8/1995 | Okudaira | 255/854 |

(List continued on next page.)

FOREIGN PATENT DOCUMENTS

| | | |
|---|---|---|
| 1-222469 | 5/1989 | Japan . |
| 5-221644 | 8/1993 | Japan . |
| 405343641 | 12/1993 | Japan . |
| 6-021333 | 1/1994 | Japan . |

OTHER PUBLICATIONS

H. Shinriki and M. Nakata, *IEEE Transaction on Electron Devices* vol. 38 No. 3 Mar. 1991.

Fazan, P.C., et al., "A High–C Capacitor (20.4fF/$\mu m^2$) with Ultrathin CVD–$Ta_2O_5$ Films Deposited on Rugged Poly–Si for High Density DRAMs", 1992 IEEE, pp. 263–266.

Lesaicherre, P–Y, et al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

(List continued on next page.)

*Primary Examiner*—Richard Booth
*Assistant Examiner*—Viktor Simkovic
*Attorney, Agent, or Firm*—Wells, St. John, Roberts, Gregory & Matkin P.S.

[57] ABSTRACT

The invention includes methods of restricting diffusion between materials. First and second different materials which are separated by a barrier layer capable of restricting diffusion of material between the first and second materials are provided. The barrier layer is formed by forming a first layer of a third material over the first material. A second layer of the third material is formed on the first layer. The second material is formed over the second layer of the third material. In another aspect, the invention relates to diffusion barrier layers. In one implementation, such a layer comprises a composite of two immediately juxtaposed and contacting, yet discrete, layers of the same material. In another aspect, the invention relates to integrated circuitry. In one implementation, a semiconductive substrate has a conductive diffusion region formed therein. An insulative dielectric layer is received over the substrate and has a conductive contact formed therein which is in electrical connection with the diffusion region. The conductive contact comprises a conductive barrier layer proximate the diffusion region. The conductive barrier layer comprises a composite of two immediately juxtaposed and contacting, yet discrete, layers of the same conductive material.

12 Claims, 3 Drawing Sheets

U.S. PATENT DOCUMENTS

| | | | |
|---|---|---|---|
| 5,466,629 | 11/1995 | Mihara et al. | 437/60 |
| 5,468,687 | 11/1995 | Carl et al. | 437/235 |
| 5,471,364 | 11/1995 | Summerfelt et al. | 361/321.4 |
| 5,504,041 | 4/1996 | Summerfelt | 437/235 |
| 5,508,953 | 4/1996 | Fukuda et al. | 365/145 |
| 5,510,651 | 4/1996 | Maniar et al. | 257/751 |
| 5,552,337 | 9/1996 | Kwon et al. | |
| 5,555,486 | 9/1996 | Kingon et al. | 361/305 |
| 5,561,307 | 10/1996 | Mihara et al. | 257/295 |
| 5,585,300 | 12/1996 | Summerfelt | |
| 5,617,290 | 4/1997 | Kulwicki et al. | |
| 5,641,702 | 6/1997 | Imai et al. | |
| 5,654,222 | 8/1997 | Sandhu et al. | 438/3 |
| 5,663,088 | 9/1997 | Sandhu et al. | 438/396 |
| 5,668,040 | 9/1997 | Byun | 438/396 |
| 5,688,724 | 11/1997 | Yoon et al. | |
| 5,728,603 | 3/1998 | Emesh et al. | |
| 5,780,359 | 7/1998 | Brown et al. | |
| 5,786,248 | 7/1998 | Schuegraf | |
| 5,790,366 | 8/1998 | Desu et al. | 361/305 |
| 5,798,903 | 8/1998 | Dhote et al. | 361/321.4 |
| 5,807,774 | 9/1998 | Desu et al. | 438/240 |
| 5,814,852 | 9/1998 | Sandhu et al. | 257/310 |
| 5,834,345 | 11/1998 | Shimizu | 438/158 |
| 5,837,591 | 11/1998 | Shimada et al. | 438/381 |
| 5,837,593 | 11/1998 | Park et al. | 438/396 |
| 5,838,035 | 11/1998 | Ramesh | |
| 5,844,771 | 12/1998 | Graettinger et al. | 361/303 |
| 5,888,295 | 3/1999 | Sandu et al. | 117/89 |
| 5,899,740 | 5/1999 | Kwon | 438/627 |
| 5,910,218 | 6/1999 | Park et al. | |
| 5,916,634 | 6/1999 | Fleming et al. | 427/255.2 |
| 5,930,584 | 7/1999 | Sun et al. | |
| 5,933,316 | 8/1999 | Ramakrishnan et al. | 361/311 |
| 5,970,369 | 10/1999 | Hara et al. | 438/488 |
| 5,990,507 | 11/1999 | Mochizuki et al. | 257/295 |
| 6,010,744 | 1/2000 | Buskirk et al. | 427/81 |
| 6,015,989 | 1/2000 | Horikawa et al. | 257/309 |
| 6,027,969 | 2/2000 | Huang et al. | 438/254 |
| 6,028,360 | 2/2000 | Nakamura et al. | 257/758 |
| 6,046,469 | 4/2000 | Yamazaki et al. | 257/306 |
| 6,051,859 | 4/2000 | Hosotani et al. | 257/306 |

OTHER PUBLICATIONS

Yamaguchi, H., et al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

Kamiyama, S., et al., "Highly Reliable 2.5nm $Ta_2O_5$ Capacitor Process Technology for 256Mbit DRAMs", 1991 IEEE, pp. 827–830.

Kamiyama, S., et al., "Ultrathin Tantalum Oxide Capacitor Dielectric Layers Fabricated Using Rapid Thermal Nitridation prior to Low Pressure Chemical Vapor Deposition", J. Electrochem. Soc., vol. 140, No. 6, Jun. 1993, pp. 1617–1625.

Eimori, T., et al., "A Newly Designed Planar Stacked Capacitor Cell with High dielectric Constant Film for 256Mbit DRAM", 1993 IEEE, pp. 631–634.

S. Wolf and R.N. Tauber, *Silicon Processing for the VLSI Era*, vol. 2, Lattice Press, pp. 589–591.

M.A. Farooq, S.P. Murarka, C.C. Chang, F.A. Baiocchi, *Tantalum nitride as a dissusion barrier between $Pd_2Si$, $CoSi2$ and aluminum*, 1989 American Institute of Physics, pp. 3017–3022.

McIntyre, Paul C. et al., "Kinetics And Mechanisms Of TiN Oxidation Beneath Pt/TiN Films", *J. Appl. Phys.*, vol. 82, No. 9, pp. 4577–4585 (Nov. 1997).

Onishi, Shigeo et al., "A Half–Micron Ferroelectric memory Cell Technology With Stacked Capacitor Structure", *I.E.E.E.*, IDEM 94–843, pp. 843–846 (1994).

U.S. application No. 09/185,412, Graettinger et al., filed Nov. 1998.

Anonymous Research Disclosure, 1989RD–0299041 titled "Double High Dielectric Capacitor", Derewent–Week 198917 (Derwent World Patent Index) no date.

6,156,638

INTEGRATED CIRCUITRY AND METHOD OF RESTRICTING DIFFUSION FROM ONE MATERIAL TO ANOTHER

TECHNICAL FIELD

This invention relates to integrated circuitry and to methods of restricting diffusion from one material to another.

BACKGROUND OF THE INVENTION

Diffusion barriers are commonly employed in semiconductor wafer fabrication to restrict diffusion between materials, such as preventing diffusion of dopant from one material to another. Diffusion barrier layer materials can be conductive or insulative. Titanium nitride and titanium are example diffusion barrier materials which are conductive. Such materials can be used, for example, at the base of a contact over or to a diffusion region in a semiconductive substrate, and be positioned intermediate the diffusion region and an overlying conductive layer.

Diffusion barriers can also be crystalline or amorphous. When comprised of a crystalline material, grain boundaries of the crystals which extend all through the layer adversely impact the material's diffusion barrier properties. This is due to potential pathways for diffusion of material along the grain boundaries being created from one surface of the layer to another. It would be desirable to develop methods and constructions which produce better barrier layer materials or constructions which are less susceptible to material diffusion along grain boundaries.

SUMMARY OF THE INVENTION

The invention in one aspect includes methods of restricting diffusion between materials. In one implementation, a method includes providing first and second different materials which are separated by a barrier layer capable of restricting diffusion of material between the first and second materials. The barrier layer being formed by forming a first layer of a third material over the first material. A second layer of the third material is formed on the first layer. The second material is formed over the second layer of the third material.

In another aspect, the invention relates to diffusion barrier layers. In one implementation, such a layer comprises a composite of two immediately juxtaposed and contacting, yet discrete, layers of the same material.

In another aspect, the invention relates to integrated circuitry. In one implementation, a semiconductive substrate has a conductive diffusion region formed therein. An insulative dielectric layer is received over the substrate and has a conductive contact formed therein which is in electrical connection with the diffusion region. The conductive contact comprises a conductive barrier layer proximate the diffusion region. The conductive barrier layer comprises a composite of two immediately juxtaposed and contacting, yet discrete, layers of the same conductive material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
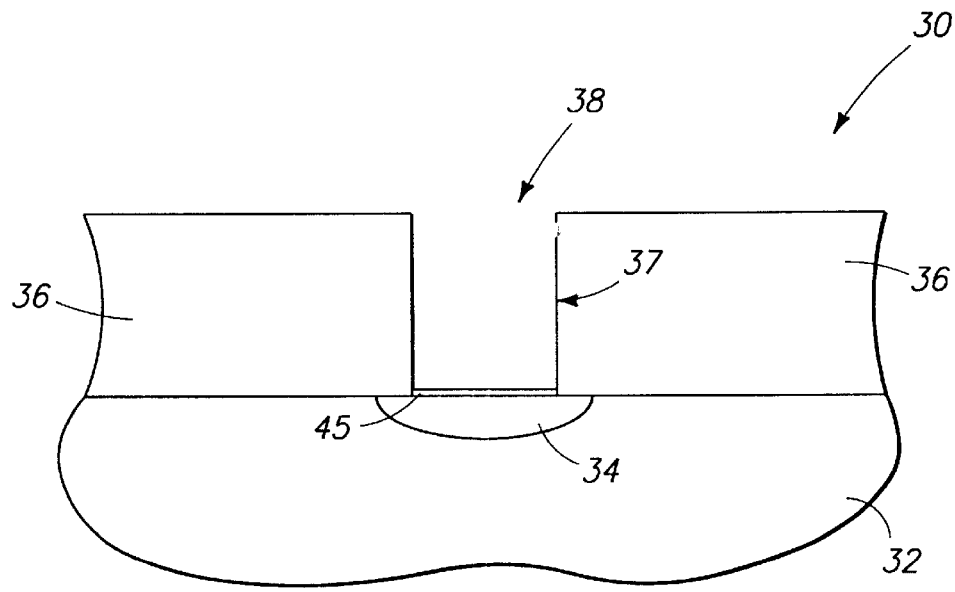
FIG. 1 is a diagrammatic sectional view of a wafer fragment at one processing step in accordance with the invention.

A semiconductor wafer in process in accordance with one aspect of the invention is indicated in FIG. 1 with reference numeral 30. Such comprises a bulk monocrystalline silicon substrate 32 having a conductive diffusion region 34 formed therein. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
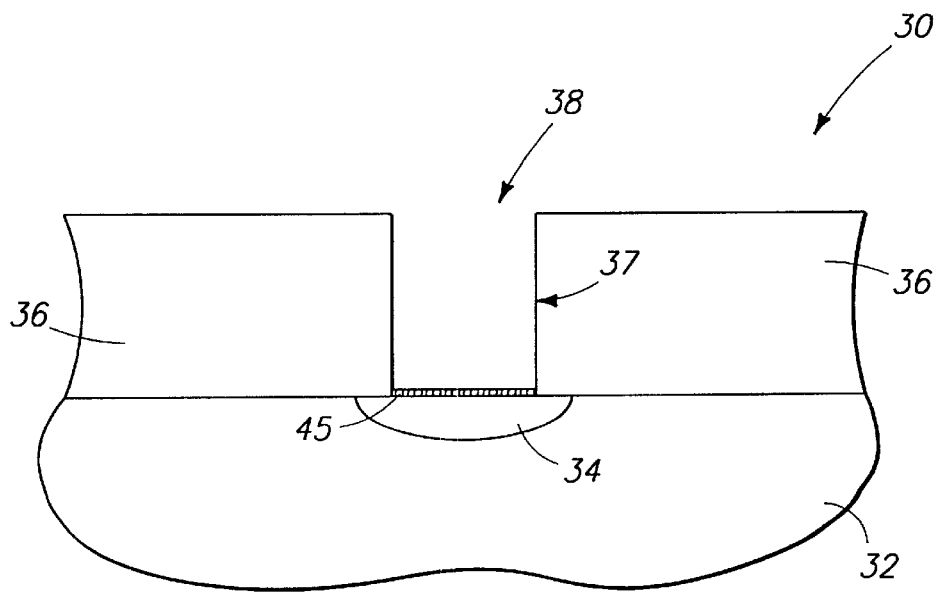
FIG. 2 is a view of the FIG. 1 wafer fragment at a step subsequent to that shown by FIG. 1.

An insulative dielectric layer 36 is formed over substrate 32. Exemplary materials are $Si_3N_4$, $SiO_2$ and doped $SiO_2$ such as borophosphosilicate glass. A contact opening 37 is formed therein to diffusion region 34. A first layer of material 45 is formed within opening 37. Example materials include electrically conductive TiN, WN, TaN, Ta, $W_xSi_yN_z$, $Ti_xSi_yN_z$, $Ta_xSi_yN_z$, $Ti_xAl_yN_z$, $Ta_xAl_yN_z$, and mixtures thereof where "x" preferably ranges from 0.3 to 0.7, "y" ranges from 0.5 to 2.0, and "z" is equal to 1-x-y. Layer 45 is preferably deposited by chemical vapor deposition (CVD). The illustrated construction can be produced by CVD followed by a planarization process such as chemical-mechanical polishing. Some of the material of layer 45 might also adhere to the walls of contact opening 37 (not shown). Layer 45 as initially formed can be either crystalline or amorphous, with an initial amorphous structure being preferred and shown. Regardless, layer 45 is preferably subsequently annealed at a temperature of at least 300° C. for a time period sufficient to achieve a selected crystalline structure intended to densify and improve conductivity of the material (FIG. 2). Exemplary anneal conditions include a temperature range of from about 300° C. to about 1200° C. at a pressure of from about 2 mTorr to about 5 atm for a treatment time of anywhere from about 1 minute to 2 hours. Unfortunately as described above with respect to the prior art, such annealing can cause sufficient crystallization to form singular grains at various locations throughout layer 45 having grain boundaries which extend from one surface of the layer to the other, as shown.

Figure 3:
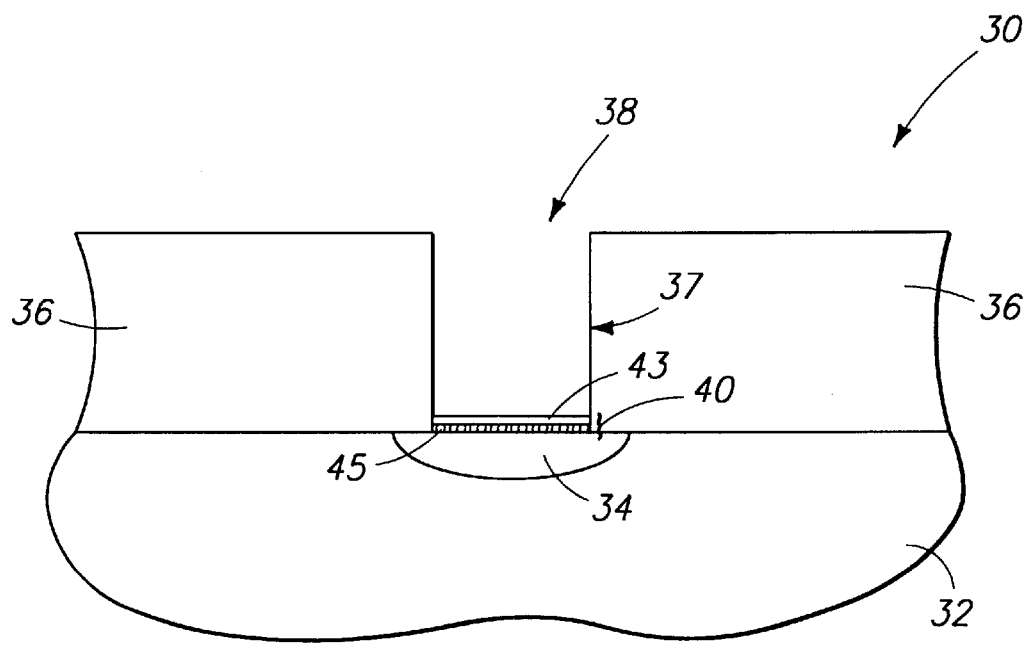
FIG. 3 is a view of the FIG. 1 wafer at a processing step subsequent to that shown by FIG. 2.

Referring to FIG. 3, a second layer 43 of the same material of layer 45 is formed on first layer 45 after the preferred layer 45 annealing, forming a composite layer 40 proximate diffusion region 34. Second layer 43 is also preferably chemical vapor deposited as above, and can initially be formed to be amorphous or crystalline. Preferably, it is initially formed to be amorphous as shown. Further, the thickness of first layer 45 of the first material is preferably chosen to be from about 10% to about 90% of the finished combined thickness of first layer 45 and second layer 43. An exemplary thickness range for the combination of layers 18 and 20 is from 60 Angstroms to 1000 Angstroms. It is most preferable that second layer 43 not be exposed to a temperature of 500° C. or greater before deposition of any subsequent layer thereover. In certain instances, exposure to such temperature for a sufficient period of time could cause complete crystal realignment relative to composite layer 40, and undesirably form grain boundaries which extend from the base of layer 45 clear through to the top of layer 43.

Figure 4:
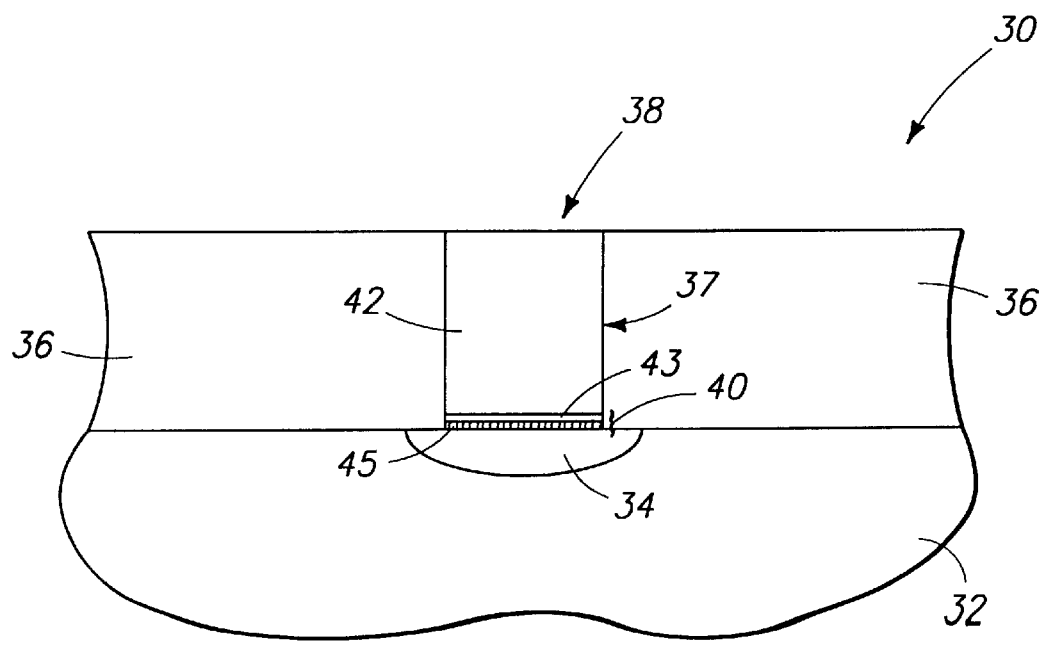
FIG. 4 is a view of the FIG. 1 wafer at a processing step subsequent shown by FIG. 3.

Referring to FIG. 4, a plugging material 42 is formed over second layer 43 and is planarized. Example materials include any conductive material, such as conductively doped semiconductive material such as polysilicon. Other examples include tungsten, titanium and titanium nitride. Material 42 and/or any intervening layer provided over layer 43 are chosen and deposited in such a way that a degree of desired stress (either tensile of compressive) will be imparted into layer 43, either during deposition or subsequently, when it is heated. Such stress can largely prevent complete recrystallization of the same material of layers 43 and 45.

Figure 5:
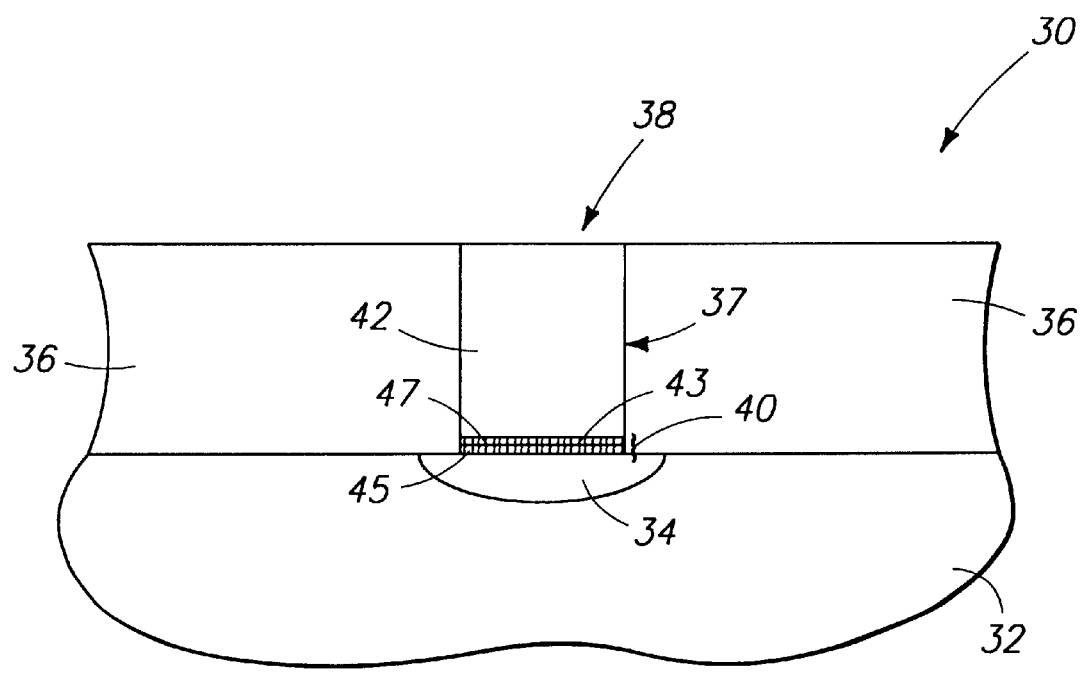
FIG. 5 is a view of the FIG. 1 wafer at a processing step subsequent to that shown by FIG. 4.

Referring to FIG. 5, layer 43 is preferably ultimately annealed either with a dedicated anneal step or in conjunction with other wafer processing to render it substantially crystalline in its finished composition.

Accordingly in the above described preferred embodiment, first layer 45 of diffusion barrier layer 40 is preferably essentially provided with a selected finished crystalline structure prior to formation of second layer 43 thereon. Also in the preferred embodiment, the final composition of second layer 43 is desirably ultimately formed to be crystalline, although alternately such could remain amorphous if so initially deposited. Where both of layers 43 and 45 are crystalline in their final form, an interface line 47 essentially forms therebetween where such discrete layers contact. Interface line 47 is characterized by a perceptible change in crystallinity from one layer to the other, such as shown or evidenced in this example by a substantial lateral shift or displacement in grain boundaries from one layer to the other.

Accordingly, the finished construction includes a contact 38 formed within opening 37 in electrical connection with diffusion region 34 through a conductive barrier layer 40. Accordingly, materials 42 and 34 constitute different first and second materials separated by a barrier layer 40 which is capable of restricting diffusion of material therebetween. Diffusion barrier layer 40 can be considered as a composite of two immediately juxtaposed and contacting, yet discrete layers of the same material.

In the context of this embodiment, such diffusion barrier layers are electrically conductive to provide good electrical contact between materials 34 and 42. However in other applications, it may be desirable that the diffusion barrier layer be formed of an electrically insulative material.

In all embodiments, fluorine or other grain boundary passivation treatments can also be conducted relative to the respective first and second layers of material intermediate or after such layers have been deposited. Example such treatments are described in our U.S. Pat. No. 5,665,611 and references cited therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact comprising:
   depositing an insulative material over a semiconductive substrate and forming a contact opening therethrough;
   depositing a conductive diffusion barrier layer material within the contact opening over the semiconductive substrate and to be amorphous as deposited;
   annealing the amorphous diffusion barrier layer material at a temperature of at least 300° C. for a time period sufficient to achieve a selected crystalline structure;
   after the annealing, depositing the same conductive diffusion barrier layer material within the contact opening on the crystalline conductive barrier layer material, said same conductive diffusion barrier layer material being amorphous as deposited; and
   depositing a conductive plugging material different from the conductive diffusion barrier layer material within the contact opening effective to form a conductive contact to semiconductive material of the semiconductive substrate, said same conductive diffusion barrier layer material not being exposed to a temperature of 500° C. or greater before forming said conductive plugging material, said same conductive diffusion barrier layer material remaining amorphous in its final composition.

2. The method of claim 1 wherein the same material is selected from the group consisting of TiN, WN, TaN, Ta, $W_xSi_yN_z$, $Ti_xSi_yN_z$, $Ta_xSi_yN_z$, $Ti_xAl_yN_z$, $Ta_xAl_yN_z$ and mixtures thereof.

3. The method of claim 1 wherein the same material comprises TiN.

4. The method of claim 1 wherein the same material comprises WN.

5. The method of claim 1 wherein the same material comprises TaN.

6. The method of claim 1 wherein the same material comprises Ta.

7. The method of claim 1 wherein the same material comprises $W_xSi_yN_z$.

8. The method of claim 1 wherein the same material comprises $Ti_xSi_yN_z$.

9. The method of claim 1 wherein the same mater comprises $Ta_xSi_yN_z$.

10. The method of claim 1 wherein the same material comprises $Ti_xAl_yN_z$.

11. The method of claim 1 wherein the same material comprises $Ta_xAl_yN_z$.

12. The method of claim 1 wherein the semiconductive material comprises a conductive diffusion region formed within the semiconductive substrate.

* * * * *

UNITED STATES PATENT AND TRADEMARK OFFICE
CERTIFICATE OF CORRECTION

PATENT NO : 6,156,638
DATED : December 5, 2000
INVENTOR(S) : Vishnu K. Agarwal et al.

It is certified that error appears in the above-identified patent and that said Letters Patent are hereby corrected as shown below:

Col. 4, Line 52, please delete "mater" and insert --"material"--.

Signed and Sealed this

First Day of May, 2001

NICHOLAS P. GODICI

Attest:

*Attesting Officer*        *Acting Director of the United States Patent and Trademark Office*